United States Patent
Radkov et al.

(10) Patent No.: US 7,906,790 B2
(45) Date of Patent: Mar. 15, 2011

(54) FULL SPECTRUM PHOSPHOR BLENDS FOR WHITE LIGHT GENERATION WITH LED CHIPS

(75) Inventors: Emil Radkov, Euclid, OH (US); Anant A. Setlur, Niskayuna, NY (US)

(73) Assignee: GE Lighting Solutions, LLC, Cleveland, OH (US)

( * ) Notice: Subject to any disclaimer, the term of this patent is extended or adjusted under 35 U.S.C. 154(b) by 1016 days.

(21) Appl. No.: 10/580,973

(22) PCT Filed: Jun. 23, 2004

(86) PCT No.: PCT/US2004/020086
§ 371 (c)(1),
(2), (4) Date: Apr. 2, 2007

(87) PCT Pub. No.: WO2005/004202
PCT Pub. Date: Jan. 13, 2005

(65) Prior Publication Data
US 2007/0276606 A1    Nov. 29, 2007

(51) Int. Cl.
*H01L 33/00* (2010.01)
*H01L 29/22* (2006.01)
*H01L 29/227* (2006.01)

(52) U.S. Cl. ............... 257/98; 257/100; 257/E33.059; 257/E33.061; 257/E33.072

(58) Field of Classification Search ............... 257/98, 257/100, E33.059, E33.061, E33.072
See application file for complete search history.

(56) References Cited

U.S. PATENT DOCUMENTS

| | | | |
|---|---|---|---|
| 6,084,250 | A | 7/2000 | Juestel et al. |
| 6,278,135 | B1 | 8/2001 | Srivastava et al. |
| 6,429,583 | B1 | 8/2002 | Levinson et al. |
| 2003/0067008 | A1 | 4/2003 | Srivastava et al. |
| 2003/0075705 | A1 | 4/2003 | Wang et al. |
| 2004/0245532 | A1 | 12/2004 | Maeda et al. |
| 2010/0019202 | A1 * | 1/2010 | Li et al. ............ 252/301.6 R |

FOREIGN PATENT DOCUMENTS

| EP | 1 574 558 A1 | 9/2005 |
|---|---|---|
| WO | WO 01/89000 | 11/2001 |
| WO | WO 01/89001 | 11/2001 |
| WO | WO 03/032407 A1 | 4/2003 |

OTHER PUBLICATIONS

HunterLab, "Equivalent White Light Sources and CIE Illuminant", *Applications Note: Insight on Color*, May 2005, vol. 17, No. 5, pp. 1-5, Copyright HunterLab 2005.

* cited by examiner

*Primary Examiner* — Ngan Ngo
(74) *Attorney, Agent, or Firm* — Fay Sharpe LLP

(57) ABSTRACT

A light emitting device including a phosphor blend including four or more phosphors emitting within a specific spectral range to optimize the color rendering index (CRI) for a given color coordinated temperature (CCT). The blend will include at least four phosphors selected from the following: a blue phosphor having an emission peak at 400-500 nm, a green phosphor having an emission peak at 500-575 nm, an orange phosphor having an emission peak from 575-615 nm, and a deep red phosphor having an emission peak at 615-680 nm. The preferred blends are used to make light sources with general CRI values ($R_a$) greater than 95 at CCT's from about 2500 to 8000 K.

17 Claims, 10 Drawing Sheets

| Blend # | 1 | 2 | 3 | 4 | 5 | 6 | 7 | 8 |
|---|---|---|---|---|---|---|---|---|
| CCT, K | 2500 | 2700 | 3000 | 3500 | 4000 | 5000 | 6500 | 8000 |
| x | 0.476 | 0.459 | 0.437 | 0.405 | 0.380 | 0.345 | 0.313 | 0.295 |
| y | 0.413 | 0.410 | 0.404 | 0.390 | 0.376 | 0.352 | 0.324 | 0.305 |
| Blue | 1.3% | 2.7% | 4.9% | 8.8% | 12.4% | 18.3% | 25.2% | 29.8% |
| Green | 20.0% | 22.3% | 25.1% | 28.4% | 30.5% | 33.0% | 33.8% | 33.7% |
| Orange | 46.8% | 45.9% | 44.3% | 41.2% | 38.2% | 32.2% | 28.7% | 25.8% |
| Red | 28.9% | 26.1% | 22.8% | 18.7% | 15.9% | 13.5% | 9.3% | 7.8% |
| LED Bleed | 3.0% | 3.0% | 3.0% | 3.0% | 3.0% | 3.0% | 3.0% | 3.0% |
| lm/W rad | 274 | 280 | 286 | 289 | 289 | 283 | 276 | 267 |
| R1 | 99 | 99 | 99 | 99 | 99 | 99 | 99 | 98 |
| R2 | 100 | 100 | 100 | 98 | 98 | 98 | 98 | 97 |
| R3 | 99 | 99 | 100 | 99 | 99 | 96 | 95 | 94 |
| R4 | 99 | 100 | 100 | 100 | 99 | 96 | 97 | 97 |
| R5 | 99 | 100 | 99 | 99 | 99 | 99 | 99 | 98 |
| R6 | 98 | 98 | 99 | 99 | 98 | 97 | 95 | 94 |
| R7 | 99 | 99 | 100 | 99 | 99 | 97 | 97 | 97 |
| R8 | 98 | 98 | 99 | 100 | 100 | 97 | 98 | 98 |
| R9 | 99 | 99 | 99 | 99 | 99 | 94 | 99 | 99 |
| R10 | 98 | 99 | 100 | 100 | 100 | 97 | 99 | 93 |
| R11 | 98 | 97 | 97 | 97 | 98 | 94 | 94 | 95 |
| R12 | 93 | 94 | 95 | 92 | 89 | 90 | 84 | 81 |
| R13 | 99 | 99 | 99 | 99 | 99 | 99 | 99 | 99 |
| R14 | 99 | 99 | 99 | 99 | 98 | 97 | 97 | 96 |
| Ra (1-8) | 99 | 99 | 99 | 99 | 98 | 97 | 97 | 97 |
| Mean R (1-14) | 98 | 99 | 99 | 98 | 98 | 96 | 96 | 95 |

Fig. 7

| Blend # | CCT | x | y | lm/W rad | Ra | Mean R | R9 | SAE | SPP | SASI red | HALO | MFG | SECA | SrAl2O4 | LED bleed |
|---|---|---|---|---|---|---|---|---|---|---|---|---|---|---|---|
| 1 | 2500 | 0.478 | 0.415 | 277 | 99 | 99 | 100 | 0.0% | 3.4% | 4.4% | 42.2% | 27.4% | 0.0% | 20.2% | 2.4% |
| 2 | 3000 | 0.438 | 0.406 | 290 | 100 | 99 | 99 | 7.7% | 19.9% | 9.8% | 23.6% | 21.3% | 0.0% | 17.0% | 0.7% |
| 3 | 4000 | 0.381 | 0.378 | 284 | 100 | 99 | 99 | 11.1% | 21.5% | 7.8% | 15.7% | 14.6% | 5.9% | 18.1% | 5.3% |
| 4 | 5000 | 0.345 | 0.353 | 279 | 100 | 99 | 99 | 12.8% | 31.1% | 6.9% | 2.0% | 11.0% | 12.3% | 19.0% | 4.8% |
| 5 | 6000 | 0.322 | 0.332 | 272 | 99 | 98 | 97 | 15.1% | 33.3% | 0.0% | 0.0% | 12.5% | 17.8% | 16.5% | 4.8% |
| 6 | 7000 | 0.306 | 0.317 | 262 | 99 | 98 | 97 | 15.1% | 30.7% | 0.0% | 0.0% | 10.4% | 20.6% | 16.4% | 6.7% |
| 7 | 8000 | 0.295 | 0.305 | 253 | 99 | 98 | 98 | 15.1% | 28.6% | 0.0% | 0.0% | 9.1% | 22.4% | 16.1% | 8.7% |

Fig. 8

FULL SPECTRUM PHOSPHOR BLENDS FOR WHITE LIGHT GENERATION WITH LED CHIPS

BACKGROUND OF THE INVENTION

The present exemplary embodiments relate to phosphor blends for the conversion of radiation emitted by a light source. They find particular application in conjunction with converting LED-generated ultraviolet (UV), violet or blue radiation into white light for general illumination purposes. It should be appreciated, however, that the invention is also applicable to the conversion of radiation from UV, violet and/or blue lasers as well as other light sources to white light.

Light emitting diodes (LEDs) are semiconductor light emitters often used as a replacement for other light sources, such as incandescent lamps. They are particularly useful as display lights, warning lights and indicating lights or in other applications where colored light is desired. The color of light produced by an LED is dependent on the type of semiconductor material used in its manufacture.

Colored semiconductor light emitting devices, including light emitting diodes and lasers (both are generally referred to herein as LEDs), have been produced from Group III-V alloys such as gallium nitride (GaN). To form the LEDs, layers of the alloys are typically deposited epitaxially on a substrate, such as silicon carbide or sapphire, and may be doped with a variety of n and p type dopants to improve properties, such as light emission efficiency. With reference to the GaN-based LEDs, light is generally emitted in the UV and/or blue range of the electromagnetic spectrum. Until quite recently, LEDs have not been suitable for lighting uses where a bright white light is needed, due to the inherent color of the light produced by the LED.

Recently, techniques have been developed for converting the light emitted from LEDs to useful light for illumination purposes. In one technique, the LED is coated or covered with a phosphor layer. A phosphor is a luminescent material that absorbs radiation energy in a portion of the electromagnetic spectrum and emits energy in another portion of the electromagnetic spectrum. Phosphors of one important class are crystalline inorganic compounds of very high chemical purity and of controlled composition to which small quantities of other elements (called "activators") have been added to convert them into efficient fluorescent materials. With the right combination of activators and host inorganic compounds, the color of the emission can be controlled. Most useful and well-known phosphors emit radiation in the visible portion of the electromagnetic spectrum in response to excitation by electromagnetic radiation outside the visible range.

By interposing a phosphor excited by the radiation generated by the LED, light of a different wavelength, e.g., in the visible range of the spectrum, may be generated. Colored LEDs are often used in toys, indicator lights and other devices. Manufacturers are continuously looking for new colored phosphors for use in such LEDs to produce custom colors and higher luminosity.

In addition to colored LEDs, a combination of LED generated light and phosphor generated light may be used to produce white light. The most popular white LEDs are based on blue emitting GaInN chips. The blue emitting chips are coated with a phosphor that converts some of the blue radiation to a complementary color, e.g. a yellow-green emission. The total of the light from the phosphor and the LED chip provides a color point with corresponding color coordinates (x and y) and correlated color temperature (CCT), and its spectral distribution provides a color rendering capability, measured by the color rendering index (CRI).

The CRI is commonly defined as a mean value for 8 standard color samples ($R_{1-8}$), usually referred to as the General Color Rendering Index and abbreviated as $R_a$, although 14 standard color samples are specified internationally and one can calculate a broader CRI ($R_{1-14}$) as their mean value. In particular, the $R_9$ value, measuring the color rendering for the strong red, is very important for a range of applications, especially of medical nature.

One known white light emitting device comprises a blue light-emitting LED having a peak emission wavelength in the blue range (from about 440 nm to about 480 nm) combined with a phosphor, such as cerium doped yttrium aluminum garnet $Y_3Al_5O_{12}:Ce^{3+}$ ("YAG"). The phosphor absorbs a portion of the radiation emitted from the LED and converts the absorbed radiation to a yellow-green light. The remainder of the blue light emitted by the LED is transmitted through the phosphor and is mixed with the yellow light emitted by the phosphor. A viewer perceives the mixture of blue and yellow light as a white light.

The blue LED-YAG phosphor device described above typically produces a white light with a general color rendering index ($R_a$) of from about 70-82 with a tunable color temperature range of from about 4000 K to 8000 K. Recent commercially available LEDs using a blend of YAG phosphor and a red phosphor ($CaS:Eu^{2+}$) provide color temperatures below 4000 K with a $R_a$ around 90. While such LEDs are suitable for some applications, many users desire a light source with an even higher $R_a$, one similar to that of incandescent lamps with a value of 95-100.

There are also white LEDs that utilize a UV emitting chip and a phosphor blend including red, green and blue emitting phosphors designed to convert the UV radiation to visible light. Their spectra tend to have either gaps (with spectral intensity of essentially zero) or a major deficiency in the deep red region of the spectrum, especially around 650 nm, which strongly degrades the $R_9$ CRI value.

It would therefore be desirable to develop new LED based solutions with a full spectrum (defined as having no gaps between 400 and 700 nm, i.e. no places wherein the emission has a spectral intensity of approximately zero) and with high values for $R_a$, $R_{1-14}$ and $R_9$. The present invention provides new and improved phosphor blends and method of formation, which overcome the above-referenced problems and others.

SUMMARY OF THE INVENTION

In a first aspect, there is provided a lighting apparatus for emitting white light including a semiconductor light source emitting radiation with a peak at from about 250 nm to about 450 nm; and a phosphor material radiationally coupled to the light source, the phosphor material including a red emitting phosphor having a peak emission between about 615 and 680 nm, an orange emitting phosphor having a peak emission between about 575 and 615 nm, a green emitting phosphor having a peak emission between about 500 and 575 nm, a blue emitting phosphor having a peak emission between about 400 and 500 nm, and additional phosphors as needed to fill any remaining gaps in the resultant light spectrum, said light apparatus having a full spectrum between 400 and 700 nm.

In a second aspect, there is provided a lighting apparatus for emitting white light including a light source emitting radiation with a peak at from about 250 nm to about 450 nm; and a phosphor material radiationally coupled to the light source, the phosphor material including a red emitting phosphor having a peak emission between about 615 and 680 nm, an orange emitting phosphor having a peak emission between about 575 and 615 nm, a green emitting phosphor having a peak emission between about 500 and 575 nm, and a blue emitting phosphor having a peak emission between about 400 and 500 nm, said light source having a general CRI index ($R_a$) greater than 95.

In a third aspect, there is provided a lighting apparatus for emitting white light including a light source emitting radiation with a peak at from about 250 nm to about 450 nm and a phosphor material radiationally coupled to the light source, the phosphor material including an orange emitting phosphor having a peak emission between about 575 and 615 nm, a blue emitting phosphor having a peak emission between about 400 and 500 nm, a red emitting phosphor having a peak emission between about 615 and 680 and a green emitting phosphor selected from the group consisting of $(Ca,Sr,Ba)Al_2O_4:Eu^{2+}$; $(Ca,Sr,Ba,Zn)_2SiO_4:Eu^{2+}$ and blends thereof.

In a fourth aspect, there is provided a phosphor blend including $(Mg,Ca,Sr,Ba,Zn)_4Si_2O_8:Eu^{2+}$ and at least three additional phosphors: an orange emitting phosphor having a peak emission between about 575 and 615 nm, a green emitting phosphor having a peak emission between about 500 and 575 nm, and a blue emitting phosphor having a peak emission between about 400 and 500 nm.

BRIEF DESCRIPTION OF THE DRAWINGS

FIG. 7 is a table showing the relevant properties of several phosphor blends according to one embodiment of the invention.

FIG. 8 is a table showing the relevant properties of several phosphor blends according to another embodiment of the invention.

DETAILED DESCRIPTION OF THE PREFERRED EMBODIMENTS

Novel phosphor blends are presented herein as well as their use in LED and other light sources. The color of the generated visible light is dependent on the particular components of the phosphor material. As used herein, the term "phosphor" is intended to include both a single phosphor compound as well as a blend of two or more phosphors unless otherwise noted.

It was determined that an LED lamp that produces a bright-white light would be useful to impart desirable qualities to LEDs as light sources. Therefore, in one embodiment of the invention, a luminescent material phosphor conversion material blend (phosphor blend) coated LED chip is disclosed for providing white light. The individual phosphors and a phosphor blend including the individual phosphors convert radiation at a specified wavelength, for example radiation from about 250 to 450 nm as emitted by a near UV or visible LED, into a different wavelength visible light. The visible light provided by the phosphor material (and LED chip if emitting visible light) comprises a bright white light with high intensity and brightness.

Figure 1:
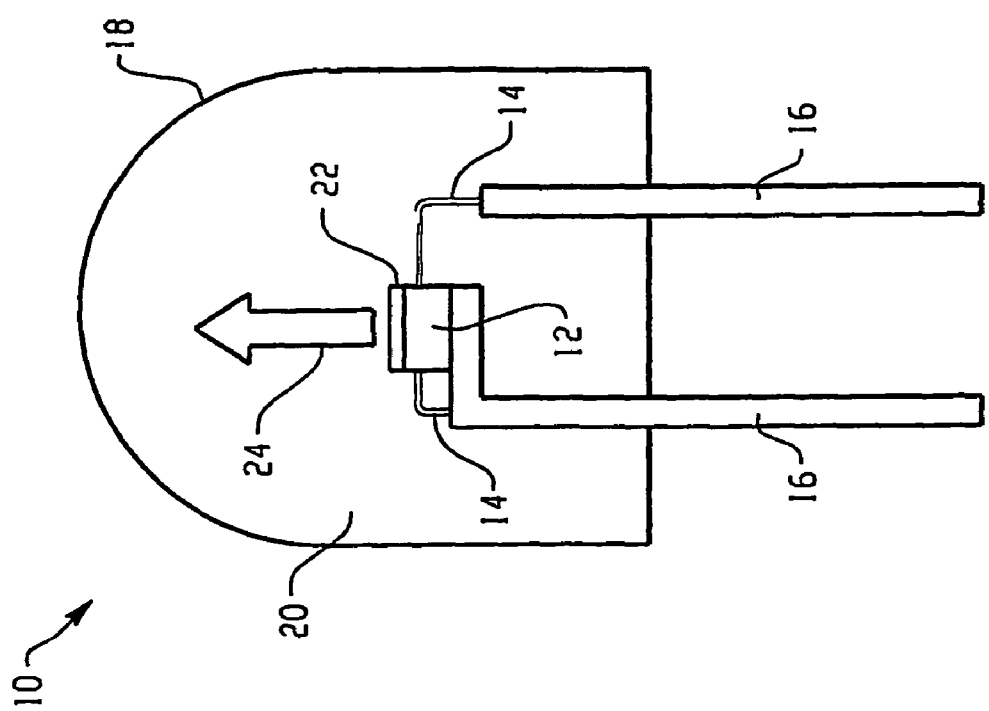
FIG. 1 is a schematic cross-sectional view of an illumination system in accordance with one embodiment of the present invention.

With reference to FIG. 1, an exemplary light emitting assembly or lamp 10 is shown in accordance with one preferred structure of the present invention. The light emitting assembly 10 comprises a semiconductor UV or visible radiation source, such as a light emitting diode (LED) chip 12 and leads 14 electrically attached to the LED chip. The leads 14 may comprise thin wires supported by a thicker lead frame(s) 16 or the leads may comprise self supported electrodes and the lead frame may be omitted. The leads 14 provide current to the LED chip 12 and thus cause the LED chip 12 to emit radiation.

The lamp may include any semiconductor visible or UV light source that is capable of producing white light when its emitted radiation is directed onto the phosphor. The preferred emission of the LED chip in the present invention will depend on the identity of the phosphors in the disclosed embodiments and may range from, e.g., 250-450 nm. In one preferred embodiment, however, the emission of the LED will be in the near UV to deep blue region and have a peak wavelength in the range from about 350 to about 430 nm. Typically then, the semiconductor light source comprises an LED doped with various impurities. Thus, the LED may comprise a semiconductor diode based on any suitable III-V, II-VI or IV-IV semiconductor layers and having an emission wavelength of about 250 to 450 nm.

Preferably, the LED may contain at least one semiconductor layer comprising GaN, ZnSe or SiC. For example, the LED may comprise a nitride compound semiconductor represented by the formula $In_iGa_jAl_kN$ (where $0 \leq i$; $0 \leq j$; $0 \leq k$ and $i+j+k=1$) having a peak emission wavelength greater than about 250 nm and less than about 450 nm. Such LED semiconductors are known in the art. The radiation source is described herein as an LED for convenience. However, as used herein, the term is meant to encompass all semiconductor radiation sources including, e.g., semiconductor laser diodes.

Although the general discussion of the exemplary structures of the invention discussed herein are directed toward inorganic LED based light sources, it should be understood that the LED chip may be replaced by an organic light emissive structure or other radiation source unless otherwise noted and that any reference to LED chip or semiconductor is merely representative of any appropriate radiation source.

The LED chip 12 may be encapsulated within a shell 18, which encloses the LED chip and an encapsulant material 20. The shell 18 may be, for example, glass or plastic. Preferably, the LED 12 is substantially centered in the encapsulant 20. The encapsulant 20 is preferably an epoxy, plastic, low temperature glass, polymer, thermoplastic, thermoset material, resin or other type of LED encapsulating material as is known in the art. Optionally, the encapsulant 20 is a spin-on glass or some other high index of refraction material. Preferably, the encapsulant material 20 is an epoxy or a polymer material, such as silicone. Both the shell 18 and the encapsulant 20 are preferably transparent or substantially optically transmissive with respect to the wavelength of light produced by the LED chip 12 and a phosphor material 22 (described below). In an alternate embodiment, the lamp 10 may only comprise an encapsulant material without an outer shell 18. The LED chip 12 may be supported, for example, by the lead frame 16, by the self supporting electrodes, the bottom of the shell 18, or by a pedestal (not shown) mounted to the shell or to the lead frame.

The structure of the illumination system includes a phosphor material 22 radiationally coupled to the LED chip 12. Radiationally coupled means that the elements are associated with each other so radiation from one is transmitted to the other. In a preferred embodiment, the phosphor material 22 is a blend of four or more phosphors, as will be detailed below.

This phosphor material 22 is deposited on the LED 12 by any appropriate method. For example, a water based suspension of the phosphor(s) can be formed, and applied as a phosphor layer to the LED surface. In one such method, a silicone slurry in which the phosphor particles are randomly suspended is placed around the LED. This method is merely exemplary of possible positions of the phosphor material 22 and LED 12. Thus, the phosphor material 22 may be coated over or directly on the light emitting surface of the LED chip 12 by coating and drying the phosphor suspension over the LED chip 12. Both the shell 18 and the encapsulant 20 should be transparent to allow light 24 to be transmitted through those elements. Although not intended to be limiting, in one embodiment, the median particle size of the phosphor material may be from about 1 to about 10 microns.

Figure 2:
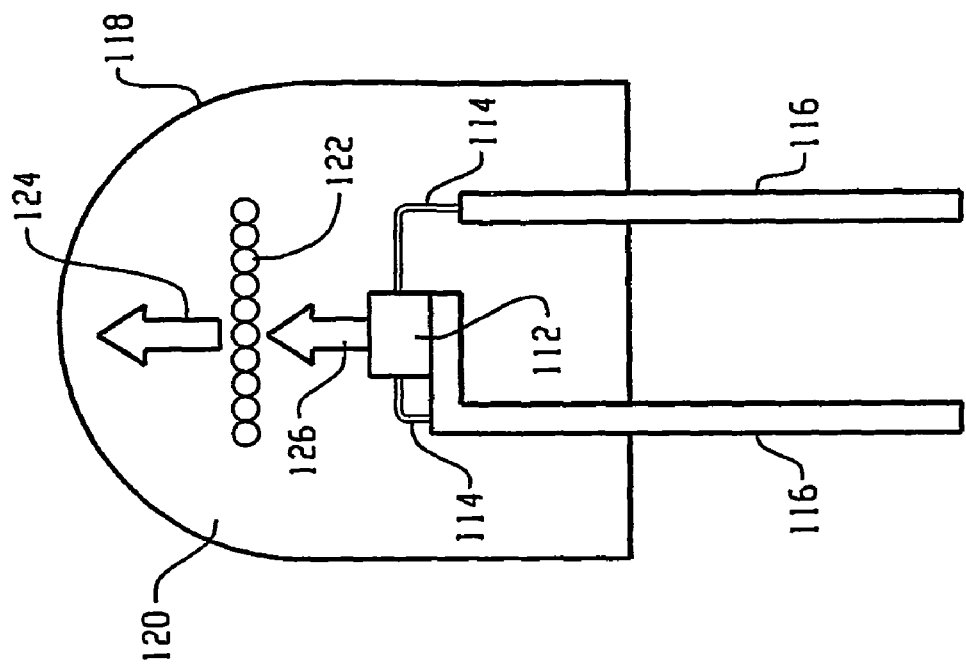
FIG. 2 is a schematic cross-sectional view of an illumination system in accordance with a second embodiment of the present invention.

FIG. 2 illustrates a second preferred structure of the system according to the preferred aspect of the present invention. The structure of the embodiment of FIG. 2 is similar to that of FIG. 1, except that the phosphor material 122 is interspersed within the encapsulant material 120, instead of being formed directly on the LED chip 112. The phosphor material (in the form of a powder) may be interspersed within a single region of the encapsulant material 120 or, more preferably, throughout the entire volume of the encapsulant material. Radiation 126 emitted by the LED chip 112 mixes with the light emitted by the phosphor material 122, and the mixed light appears as white light 124. If the phosphor is to be interspersed within the encapsulant material 120, then a phosphor powder may be added to a polymer precursor, loaded around the LED chip 112, and then the polymer precursor may be cured to solidify the polymer material. Other known phosphor interspersion methods may also be used, such as transfer loading.

Figure 3:
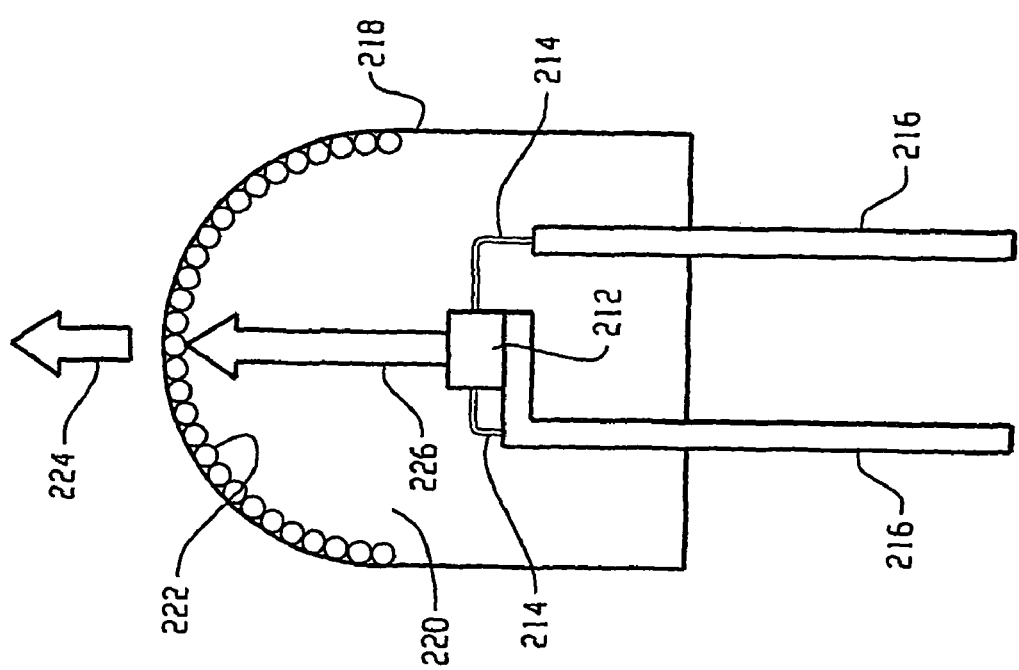
FIG. 3 is a schematic cross-sectional view of an illumination system in accordance with a third embodiment of the present invention.

FIG. 3 illustrates a third preferred structure of the system according to the preferred aspects of the present invention. The structure of the embodiment shown in FIG. 3 is similar to that of FIG. 1, except that the phosphor material 222 is coated onto a surface of the shell 218, instead of being formed over the LED chip 212. The phosphor material is preferably coated on the inside surface of the shell 218, although the phosphor may be coated on the outside surface of the shell, if desired. The phosphor material 222 may be coated on the entire surface of the shell or only a top portion of the surface of the shell. The radiation 226 emitted by the LED chip 212 mixes with the light emitted by the phosphor material 222, and the mixed light appears as white light 224. Of course, the structures of FIGS. 1-3 may be combined and the phosphor may be located in any two or all three locations or in any other suitable location, such as separately from the shell or integrated into the LED.

In any of the above structures, the lamp 10 may also include a plurality of scattering particles (not shown), which are embedded in the encapsulant material. The scattering particles may comprise, for example, $Al_2O_3$ particles such as alumina powder or $TiO_2$ particles. The scattering particles effectively scatter the coherent light emitted from the LED chip, preferably with a negligible amount of absorption.

Figure 4:
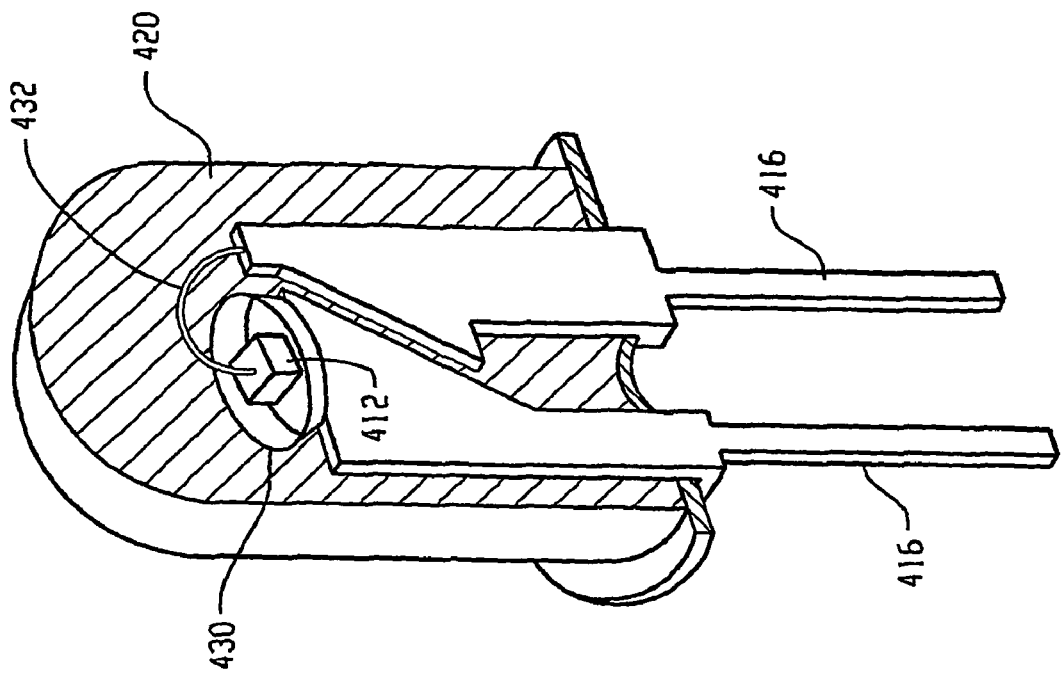
FIG. 4 is a cutaway side perspective view of an illumination system in accordance with a fourth embodiment of the present invention.

As shown in a fourth preferred structure in FIG. 4, the LED chip 412 may be mounted in a reflective cup 430. The cup 430 may be made from or coated with a reflective material, such as alumina, titania, or other dielectric powder known in the art. A preferred reflective material is $Al_2O_3$. The remainder of the structure of the embodiment of FIG. 4 is the same as that of any of the previous Figures, and includes two leads 416, a conducting wire 432 electrically connecting the LED chip 412 with the second lead, and an encapsulant material 420.

In one embodiment, the invention provides a phosphor blend, which may be used in the phosphor material 22 in the above described LED light, wherein the phosphor material is a blend of a red emitting phosphor, an orange emitting phosphor, a green emitting phosphor and a blue emitting phosphor.

The specific amounts of the individual phosphors used in the phosphor material 22 will depend upon the desired color temperature. The relative amounts of each phosphor in the phosphor blend can be described in terms of spectral weight. The spectral weight is the relative amount that each phosphor contributes to the overall emission spectrum of the device. The spectral weight amounts of all the individual phosphors and any residual bleed from the LED source should add up to 100%. In a preferred embodiment, each of the above described phosphors in the blend will have a spectral weight ranging from about 1 to 75%.

Figure 5:
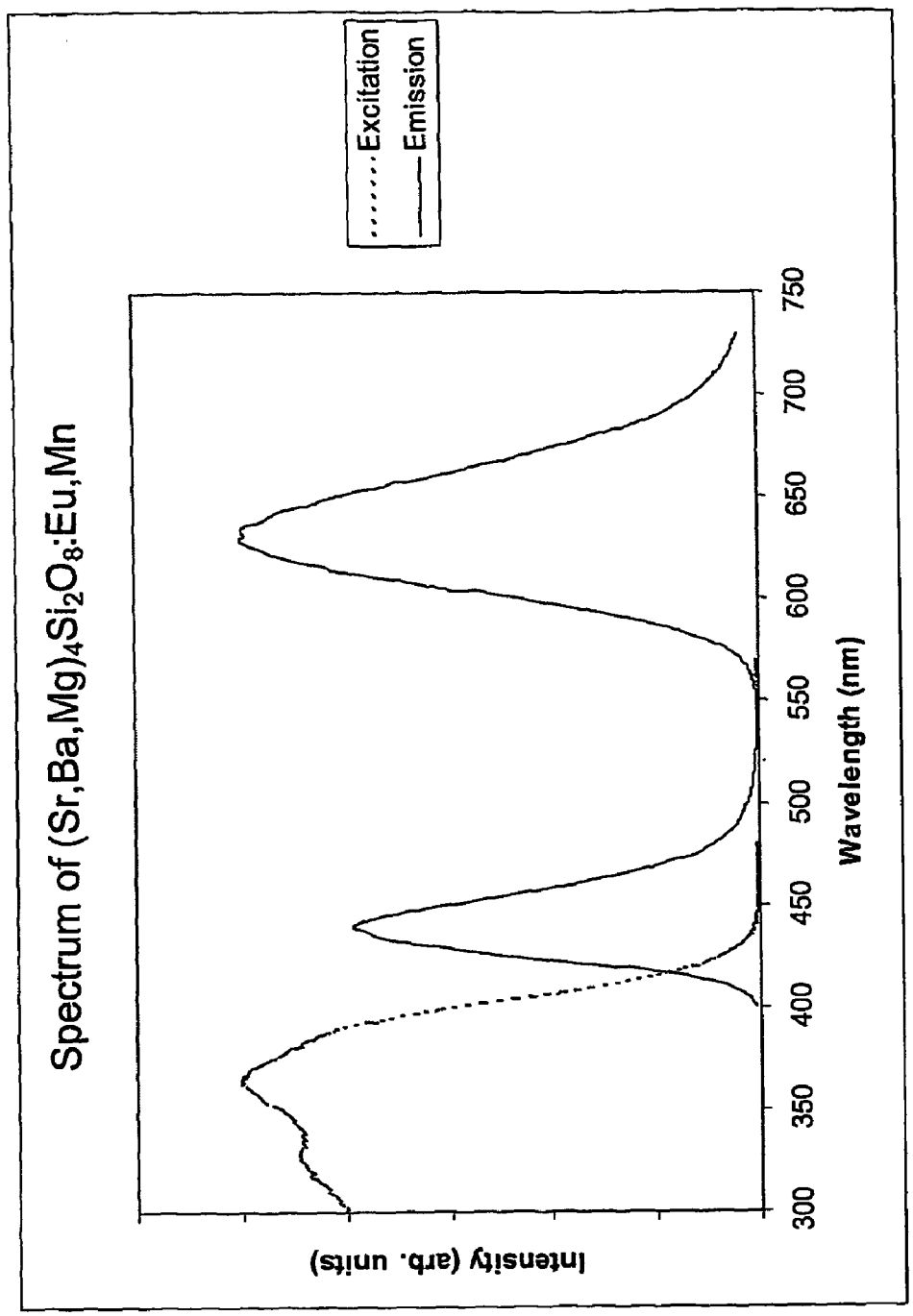
FIG. 5 are the emission and absorption spectra of $(Sr,Ba,Mg)_4Si_2O_8:Eu^{2+},Mn^{2+}$.

Suitable red-emitting phosphors include those having an emission band with a maximum between about 615 nm and 680 nm, more preferably between about 625 nm and 660 nm. Specifically, suitable red-emitting phosphors preferably include $3.5MgO*0.5MgF*GeO_2:Mn^{4+}$ ("MFG") and/or $(Mg,Ca,Sr,Ba,Zn)_4Si_2O_8:Eu^{2+},Mn^{2+}$ (SASI Red). The excitation and emission spectra of $(Sr,Ba,Mg)_4Si_2O_8:Eu^{2+},Mn^{2+}$ are shown in FIG. 5.

Suitable orange-emitting phosphors include those having an emission band with a maximum between about 575 nm and 615 nm, more preferably between about 580 nm and 610 nm. Specifically, suitable orange-emitting phosphor formulations preferably include $(Ca,Sr,Ba)_5(PO_4)_3(F,Cl,Br,OH):Eu^{2+},Mn^{2+}$ ("HALO") and/or $(Mg,Ca,Sr,Ba,Zn)_2P_2O_7:Eu^{2+},Mn^{2+}$ ("SPP").

Figure 6:
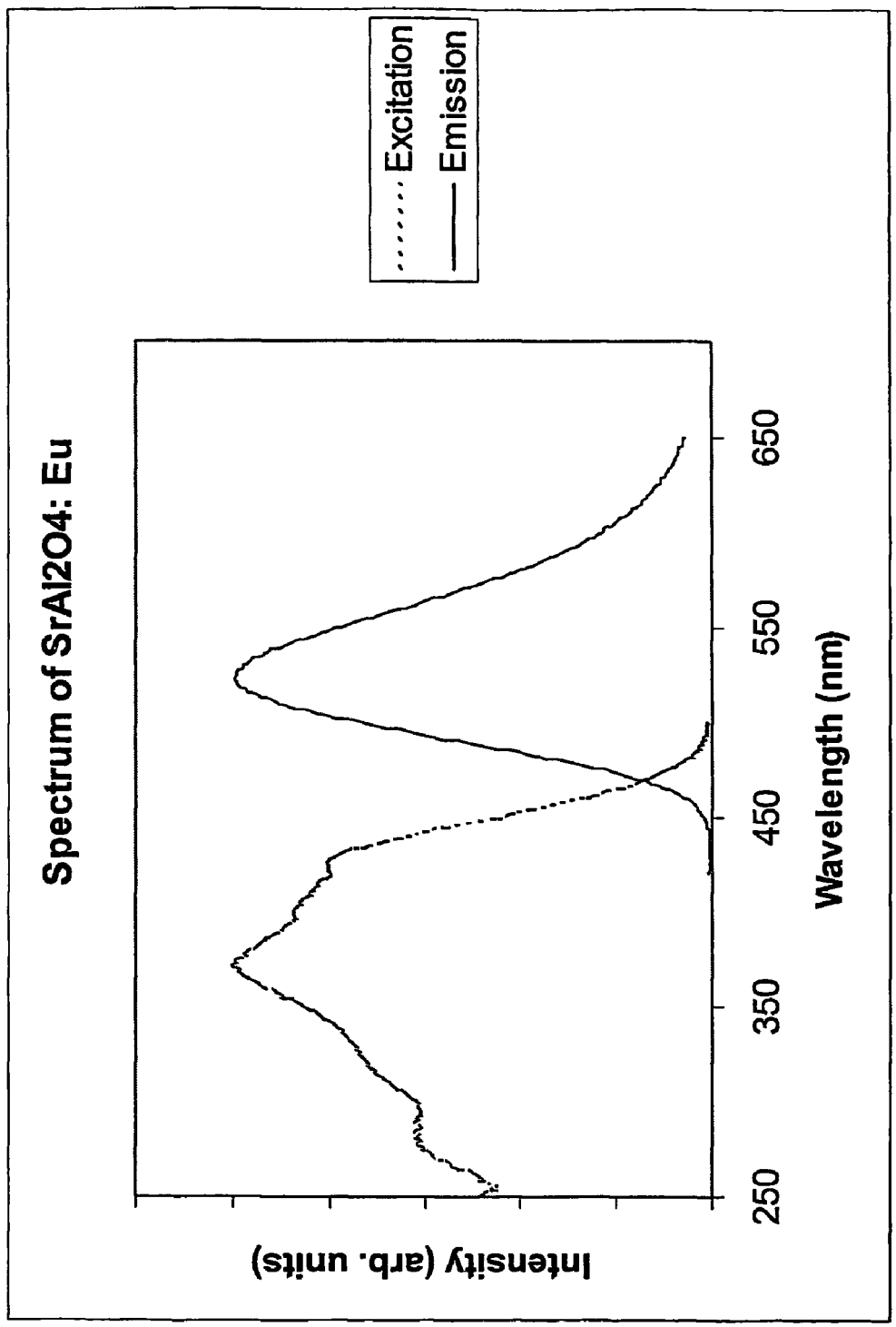
FIG. 6 are the emission and absorption spectra of $SrAl_2O_4:Eu^{2+}$.

Suitable green-emitting phosphors include those having an emission band with a maximum between about 500 nm and 575 nm, more preferably between about 490 nm and 560 nm, more preferably between about 515 nm and 545 nm. Specifically, suitable green-emitting phosphors may be selected from the group consisting of $(Ca,Sr,Ba)Al_2O_4:Eu^{2+}$; $(Ca,Sr,Ba,Zn)_2SiO_4:Eu^{2+}$, and/or mixtures thereof. The excitation and emission spectra of $SrAl_2O_4:Eu^{2+}$ are shown in FIG. 6.

Suitable blue-emitting phosphors include those having an emission band with a maximum between about 400 nm and 500 nm, more preferably between about 440 nm and 460 nm. Specifically, suitable blue-emitting phosphors may be preferably selected from the group consisting of $(Ca,Sr,Ba)_5(PO_4)_3(F,Cl,Br,OH):Eu^{2+}$ ("SECA"), and $(Ca,Sr,Ba)Mg_{x\text{-}}Al_yO_{(1+x+1.5y)}:Eu^{2+}$ ("BAM") wherein x is an integer between about 1 and 5 and y is an integer between about 5 and 25, and mixtures thereof.

Other phosphors may be utilized in the phosphor blend, in a wide range of combinations to fill in any remaining gaps in the emission spectrum of the blends, as necessary. Suitable phosphors for filling gaps may include, for example, $Sr_4Al_{14}O_{25}:Eu^{2+}$; $(Mg,Ca,Sr,Ba,Zn)_4Si_2O_8:Eu^{2+}$; $(Ba,Ca,Sr)_2MgAl_{16}O_{27}:Eu^{2+},Mn^{2+}$, and mixtures thereof.

It will be appreciated by a person skilled in the art that other phosphors with sufficiently similar emission spectra may be used instead of any of the preceding suitable examples of red, orange, green, blue, or "gap-filling" phosphors, even though the chemical formulations of such substitutes may be significantly different from the ones listed in the aforementioned examples.

Additionally, part of the LED light may be allowed to bleed through and contribute to the light spectrum of the device if necessary for achieving full spectrum appearance. The amount of LED bleed can be adjusted by changing the optical density of the phosphor layer, as routinely done for industrial blue chip based white LEDs. Alternatively, it may be adjusted by using a suitable filter or a pigment, as described further below.

Preferably, utilizing the above phosphor blends will produce lighting devices with a resultant full emission spectrum between 400 and 700 nm over the CCT range of 2500 to 8000 K. A "full spectrum" is defined herein as one without any gaps (i.e. where the spectral intensity is essentially zero) within the specified wavelength region.

In another preferred embodiment, the phosphor material includes four phosphors selected from the group consisting of: $(Mg,Sr,Ba,Zn)_2P_2O_7:Eu^{2+},Mn^{2+}$; $(Ca,Sr,Ba)_5(PO_4)_3(F,Cl,OH):Eu^{2+},Mn^{2+}$; $3.5MgO*0.5MgF_2*GeO_2:Mn^{4+}$; $Sr_4Al_{14}O_{24}:Eu^{2+}$; $(Sr,Ba,Ca)_5(PO_4)_3(Cl,OH):Eu^{2+}$; $(Ca,Sr,Ba)Al_2O_4:Eu^{2+}$; $(Ca,Sr,Ba,Zn)_2SiO_4:Eu^{2+}$, $(Mg,Ca,Sr,Ba,Zn)_4Si_2O_8:Eu^{2+},Mn^{2+}$; and $(Ca,Sr,Ba)Mg_xAl_yO_{(1+x+1.5y)}:Eu^{2+}$, wherein x is an integer between about 1 and 5 and y is an integer between about 5 and 25. The amount of activator doping in each phosphor will generally vary from 0.001 to 50 mole percent, preferably from about 0.01 to 30%.

The above described phosphors may be produced using known solid state reaction processes for the production of phosphors by combining, for example, elemental oxides, carbonates and/or hydroxides as starting materials. Other starting materials may include nitrates, sulfates, acetates, citrates, or oxalates. In a typical process, the starting materials are combined via a dry or wet blending process and fired in air or under a reducing atmosphere at from, e.g., 900 to 1600° C.

A fluxing agent may be added to the mixture before or during the step of mixing. This fluxing agent may be $NH_4Cl$ or any other conventional fluxing agent, such as a fluoride of at least one metal selected from the group consisting of terbium, aluminum, gallium, and indium. A quantity of a fluxing agent of less than about 20, preferably less than about 10, percent by weight of the total weight of the mixture is adequate for fluxing purposes.

The starting materials may be mixed together by any mechanical method including, but not limited to, stirring or blending in a high-speed blender or a ribbon blender. The starting materials may be combined and pulverized together in a bowl mill, a hammer mill, or a jet mill. The mixing may be carried out by wet milling especially when the mixture of the starting materials is to be made into a solution for subsequent precipitation. If the mixture is wet, it may be dried first before being fired under a reducing atmosphere at a temperature from about 900° C. to about 1700° C., preferably from about 900° C. to about 1500° C., for a time sufficient to convert all of the mixture to the final material.

The firing may be conducted in a batchwise or continuous process, preferably with a stirring or mixing action to promote good gas-solid contact. The firing time depends on the quantity of the mixture to be fired, the rate of gas conducted through the firing equipment, and the quality of the gas-solid contact in the firing equipment. Typically, a firing time up to about 10 hours is adequate. The reducing atmosphere typically comprises a reducing gas such as hydrogen, carbon monoxide, or a combination thereof, optionally diluted with an inert gas, such as nitrogen, argon, or a combination thereof. Alternatively, the crucible containing the mixture may be packed in a second closed crucible containing high-purity carbon particles and fired in air so that the carbon particles react with the oxygen present in air, thereby, generating carbon monoxide for providing a reducing atmosphere.

In one embodiment, these compounds may be blended and dissolved in a nitric acid solution. The strength of the acid solution is chosen to rapidly dissolve the oxygen-containing compounds and the choice is within the skill of a person skilled in the art. Ammonium hydroxide is then added in increments to the acidic solution. An organic base such as methanolamine, ethanolamine, propanolamine, dimethanolamine, diethanolamine, dipropanolamine, trimethanolamine, triethanolamine, or tripropanolamine may be used in place of ammonium hydroxide.

The precipitate may be filtered, washed with deionized water, and dried. The dried precipitate may be ball milled or otherwise thoroughly blended and then calcined in air at about 400° C. to about 1600° C. for a sufficient time to ensure a substantially complete dehydration of the starting material. The calcination may be carried out at a constant temperature. Alternatively, the calcination temperature may be ramped from ambient to and held at the final temperature for the duration of the calcination. The calcined material is similarly fired at 1000-1600° C. for a sufficient time under a reducing atmosphere such as $H_2$, CO, or a mixture of one of theses gases with an inert gas, or an atmosphere generated by a reaction between a coconut charcoal and the products of the decomposition of the starting materials to covert all of the calcined material to the desired phosphor compound.

It may be desirable to add pigments or filters to the phosphor material. The phosphor layer 22 may also comprises from 0 up to about 5% by weight (based on the total weight of the phosphors) of a pigment or other UV absorbent material capable of absorbing UV radiation having a wavelength between 250 nm and 450 nm.

Suitable pigments or filters include any of those known in the art that are capable of absorbing radiation generated between 250 nm and 450 nm. Such pigments include, for example, nickel titanate or praseodimium zirconate. The pigment is used in an amount effective to filter 10% to 100%, of the radiation generated in the 250 nm to 450 nm range.

By assigning appropriate spectral weights for each phosphor, one can create spectral blends to cover the relevant portions of color space, especially for white lamps. Specific examples of this are shown below. For various desired CCT's, CRI's and color points, one can determine the appropriate amounts of each phosphor to include in the blend. Thus, one can customize phosphor blends to produce almost any CCT or color point, with corresponding high CRI. The examples shown are for representative spectra of each phosphor. Of course, the color of each phosphor will be dependent upon its exact composition (e.g. relative amounts of Ba, Ca, Sr, as well as Eu in BAM phosphor), which can change the color of the phosphor to a degree where it may have to be renamed, e.g. green instead of blue. In addition, some phosphors such as SASI Red and HALO may emit a secondary blue peak from the co-activator ($Eu^{2+}$ in this case), which will contribute to the emission from the blue phosphor in the blend (SECA or BAM). However, determining the changes in the spectral weight to produce the same or similar characteristic lighting device necessitated by such variations is trivial and can be accomplished by one skilled in the art using various methodologies, such as design of experiment (DOE) or other strategies.

By use of the present invention, particularly the blends described in embodiment two, lamps can be provided having general CRI ($R_a$) values greater than 95, over the entire range of color temperatures of interest for general illumination (2500 K to 8000 K). In some blends, the CRI values approach the theoretical maximum of 100, both for the general CRI value ("Ra") and the mean CRI value ($R_{1-14}$). In addition, the $R_9$ value for these blends can exceed 90 and approach the theoretical maximum as well.

EXAMPLES

Various light sources using phosphor blends according to the above embodiments are presented. Two different trials were conducted with the results shown in the tables of FIGS. 7 and 8, respectively. The phosphors used in the trials of FIG. 7 are $3.5MgO*0.5MgF_2*GeO_2:Mn^{4+}$ ("MFG") as red, $Ca_5(PO_4)_3Cl:Eu^{2+},Mn^{2+}$ ("HALO") for orange, $SrAl_2O_4:Eu^{2+}$ for green and $(Ca,Sr,Ba)_5(PO_4)_3Cl:Eu^{2+}$ ("SECA") for blue. The phosphors used in the trials of FIG. 8 are $3.5MgO*0.5MgF_2*GeO_2:Mn^{4+}$ ("MFG"); $Ca_5(PO_4)_3Cl:Eu^{2+},Mn^{2+}$ ("HALO"); $SrAl_2O_4:Eu^{2+}$; $Sr_2P_2O_7:Eu^{2+},Mn^{2+}$ ("SPP"); $Sr_4Al_{14}O_{24}:Eu^{2+}$ ("SAE"); $(Sr,Ba,Ca)_5(PO_4)_3Cl:Eu^{2+}$ ("SECA"); and $(Sr,Ba,Mg)_4Si_2O_8:Eu^{2+},Mn^{2+}$ ("SASI red").

The specific amounts (in percents) of each phosphor based on spectral weight is shown in the Tables along with the spectral contribution of UV bleed. The predicted color coordinates on the CIE chromaticity diagram (x and y) of these phosphors along with the luminosity (lm/W), CRI values ($R_1$-$R_{14}$, $R_a$), and coordinated color temperature (CCT) of these blends were calculated. The results are shown in the tables.

Figure 10:
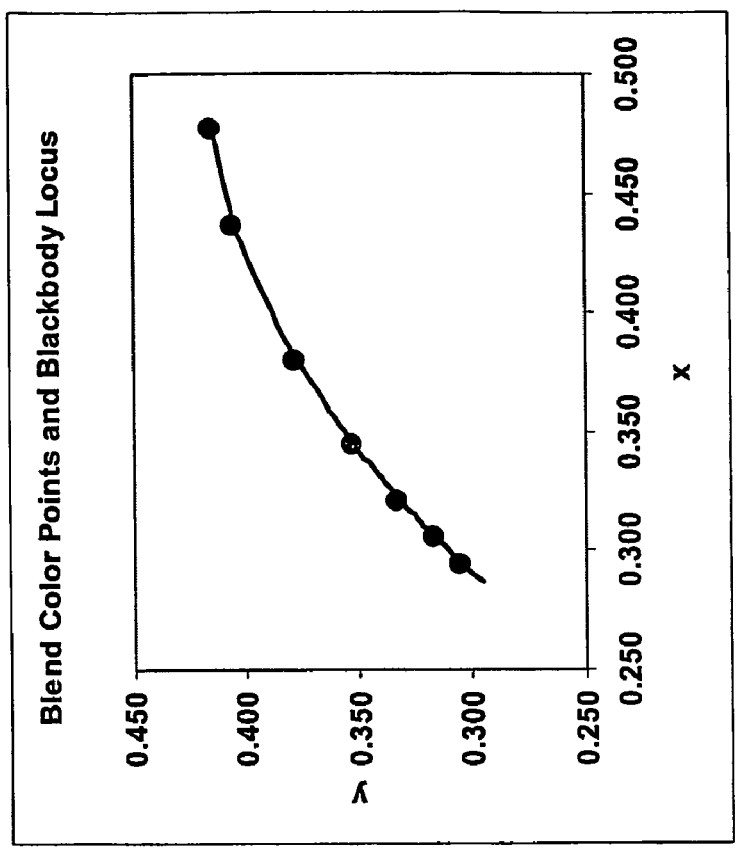
FIG. 10 is a graph showing the color points of the blends of FIG. 7 compared to the black body locus on the CIE chromaticity diagram.
Figure 9:
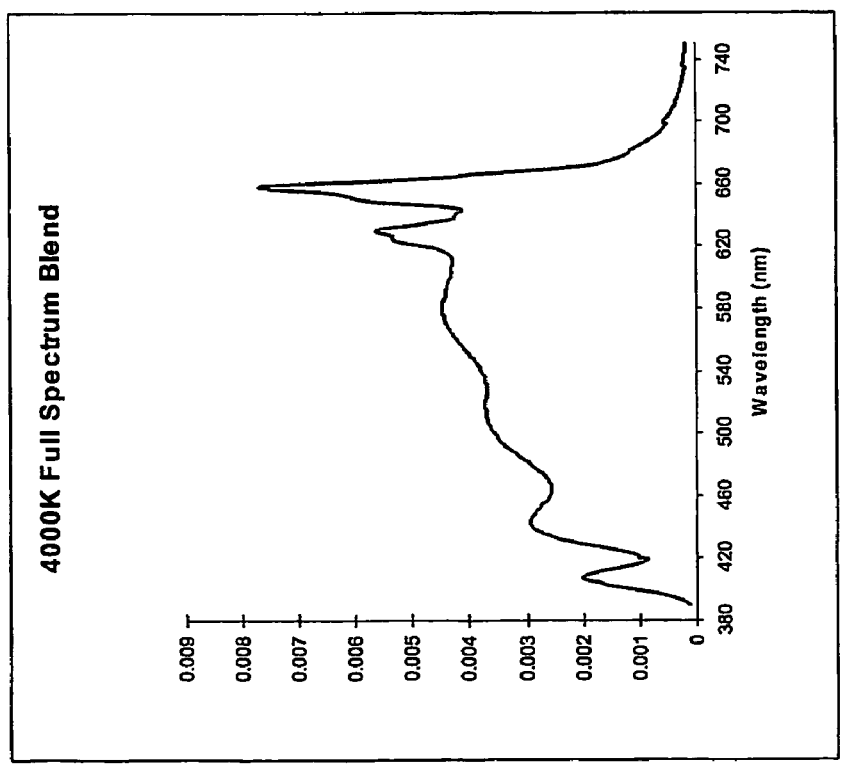
FIG. 9 is the emission spectrum of one phosphor blend having a CCT of 4000 K in accordance with one formulation of FIG. 7.
Figure 11A:
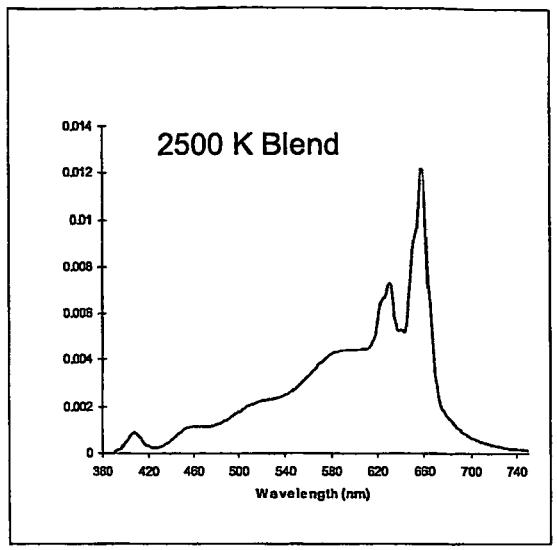
FIGS. 11a-11h are emission spectra of several phosphor blends having different CCT's according to the embodiments of FIG. 8.
Figure 11B:
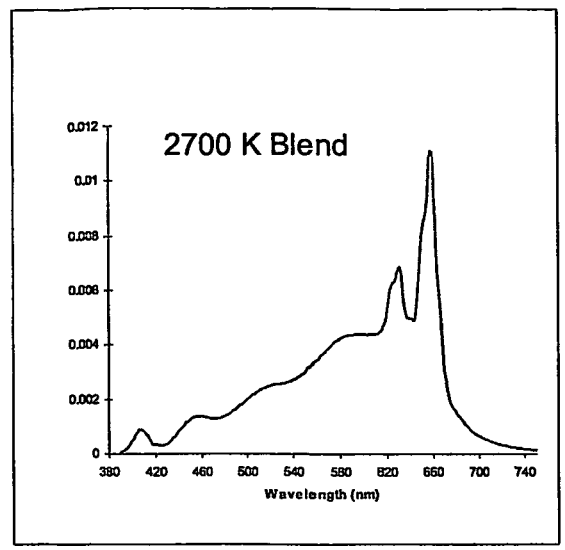
Figure 11C:
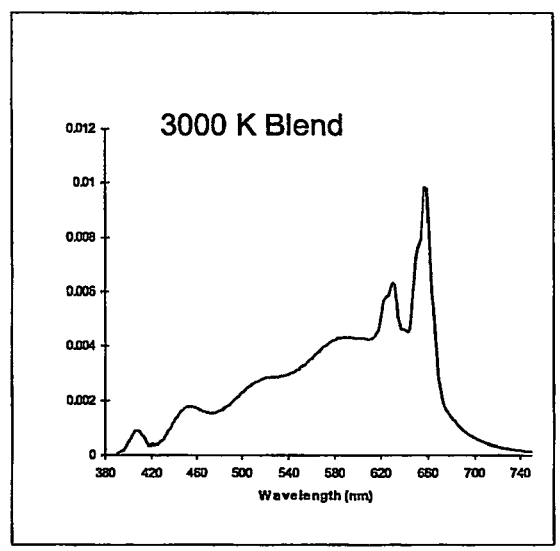
Figure 11D:
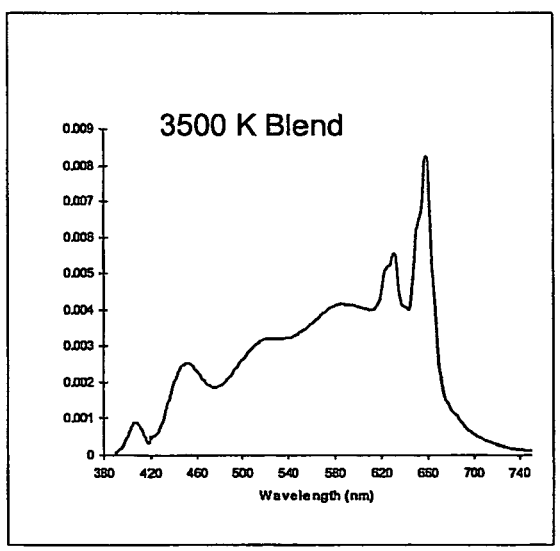
Figure 11E:
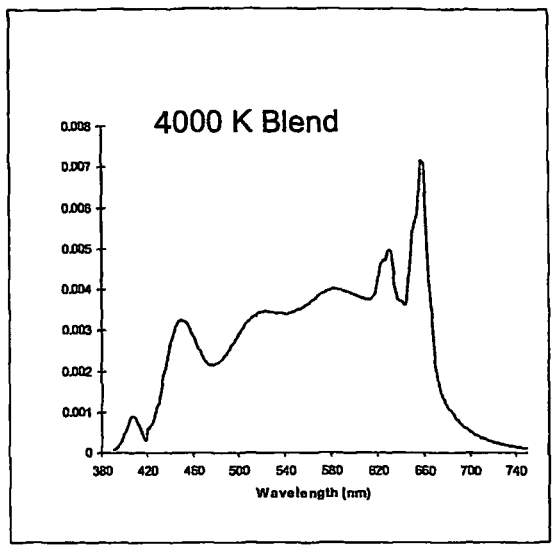
Figure 11F:
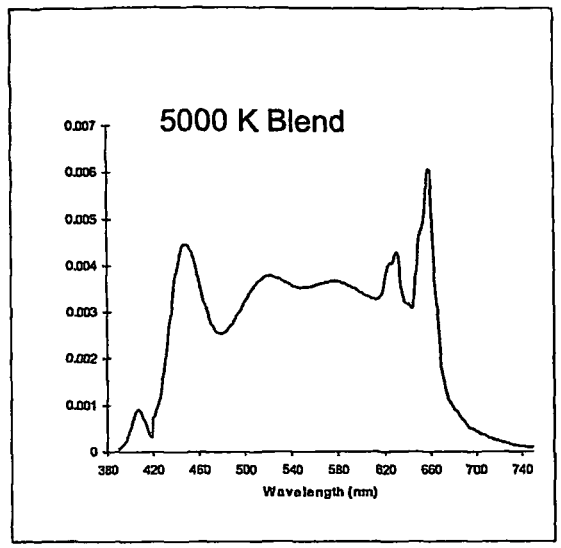
Figure 11G:
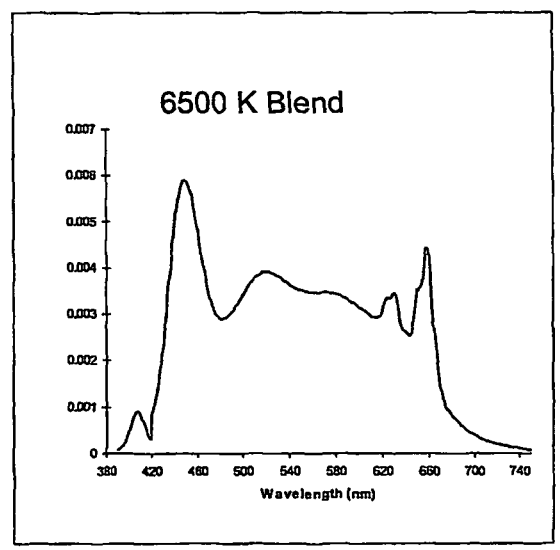
Figure 11H:
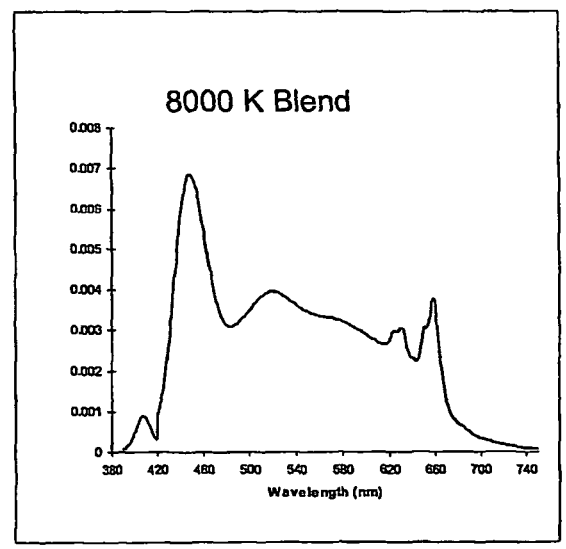
Figure 12:
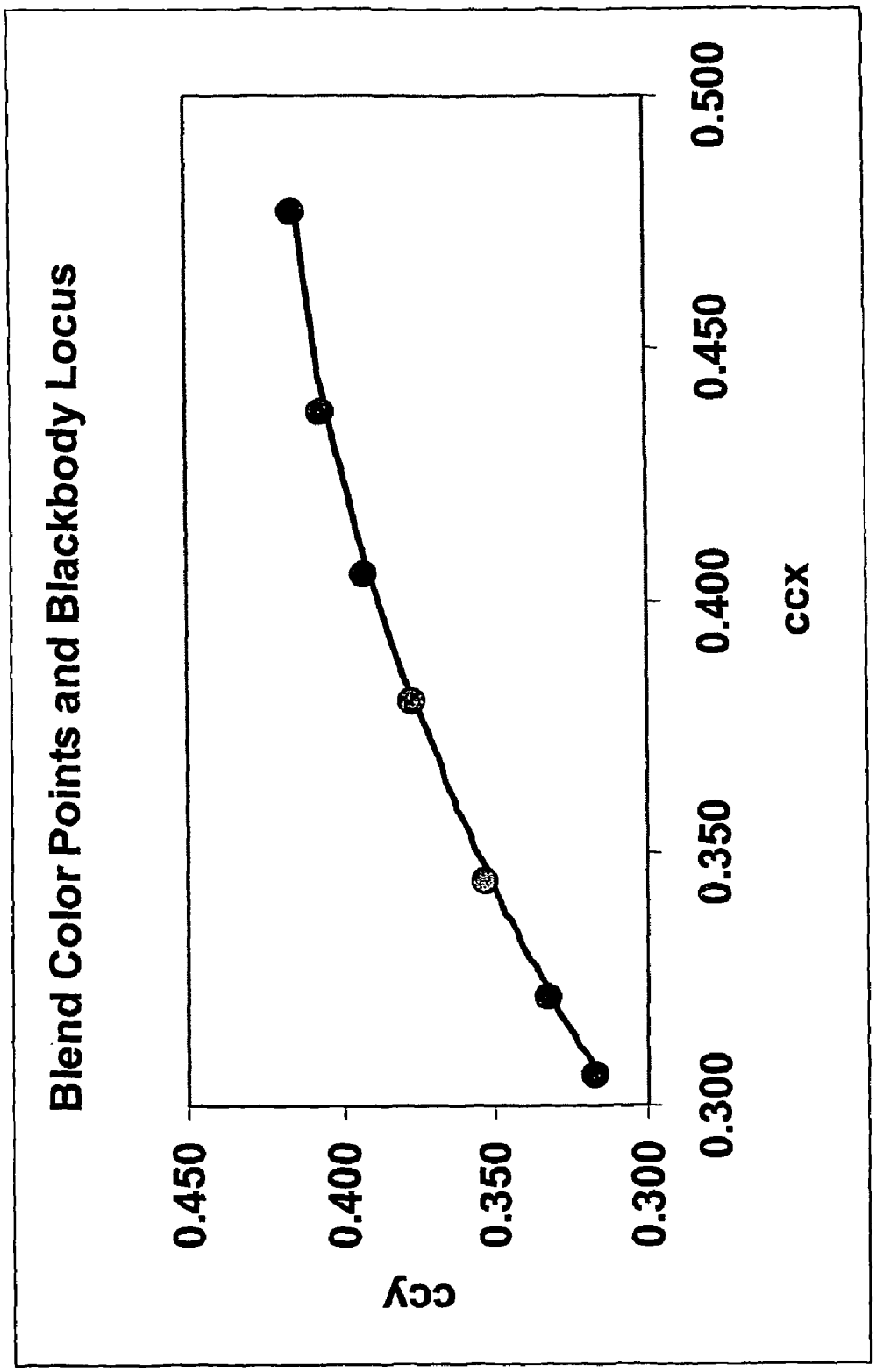
FIG. 12 is a graph showing the color points of the blends of FIG. 8 compared to the black body locus on the CIE chromaticity diagram.

The calculated emission spectrum of the 4000 K blend (blend 3) of FIG. 8 is shown in FIG. 9. In addition, it can be seen in FIG. 10 that the emissions of the light sources of FIG. 8 substantially match the black body locus on the CIE chromaticity diagram throughout a range of color points The calculated emission spectrum of each of the blends in FIG. 7 can be seen in FIGS. 11a-11h. In addition, it can be seen in FIG. 12 that the emissions of these phosphor blends substantially match the black body locus on the CIE chromaticity diagram throughout a range of color points. Preferably, the color point of the phosphor lies within about ±0.01 and more preferably within about ±0.002 of the black body locus on the x and y axes. Thus, the use of the above described phosphor blends allows the production of light sources with extremely high CRI values approaching those achieved by reference illuminants throughout the useful CCT range, thereby allowing the replacement of such illuminants with LEDs in almost any application.

The invention has been described with reference to the preferred embodiment. Obviously, modifications and alterations will occur to others upon reading and understanding the preceding, detailed description. It is intended that the invention be construed as including all such modifications and alterations, insofar as they come within the scope of the appended claims or the equivalents thereof.

What is claimed is:

1. A lighting apparatus for emitting white light comprising: a semiconductor light source emitting radiation at from about 250 nm to about 450 nm; and a phosphor material radiationally coupled to the light source, the phosphor material comprising a red emitting phosphor having a peak emission between about 615 and 680 nm, an orange emitting phosphor having a peak emission between about 575 and 615 nm, a green emitting phosphor having a peak emission between about 500 and 575 nm, a blue emitting phosphor having a peak emission between about 400 and 500 nm, and one or more additional gap filling phosphors, wherein said lighting apparatus has a full spectrum between 400 and 700 nm.

2. The lighting apparatus of claim 1, wherein the light source comprises one of an LED and an organic emissive structure.

3. The lighting apparatus of claim 1, further comprising an encapsulant surrounding the light source.

4. The lighting apparatus of claim 3, wherein the phosphor material is dispersed in the encapsulant.

5. The lighting apparatus of claim 1, further comprising a reflector cup.

6. The lighting apparatus of claim 1, further including a pigment, filter or other absorber capable of absorbing radiation generated between 250 nm and 450 nm.

7. The lighting apparatus of claim 1, wherein said red phosphor comprises at least one of (Mg, Ca, Sr, Ba, Zn)4Si2O8:Eu2+, Mn2+; and 3.5MgO*0.5MgF2*GeO2:Mn4+.

8. The lighting apparatus of claim 1, wherein said green phosphor comprises at least one of (Ca, Sr, Ba) Al2O4:Eu2+; and (Ca, Sr, Ba, Zn) 2SiO4:Eu2+.

9. The lighting apparatus of claim 1, wherein said blue phosphor comprises at least one of (Ca, Sr, Ba) 5 (PO4) 3 (F, Cl, Br, OH):Eu2+, and (Ca, Sr, Ba) MgxAlyO(1+x+1.5y):Eu2+, wherein x is an integer between about 1 and 5 and y is an integer between about 5 and 25.

10. The lighting apparatus of claim 1, wherein said orange phosphor comprises at least one of (Mg, Ca, Sr, Ba, Zn)2P2O7:Eu2+, Mn2+ and (Ca, Sr, Ba) 5 (PO4) 3 (F, Cl, Br, OH):Eu2+, Mn2+.

11. The lighting apparatus of claim 1, wherein said gap filling phosphors are selected from one or more of Sr4Al14O25:Eu2+; (Mg, Ca, Sr, Ba, Zn) 4Si2O8:Eu2+; (Ba, Ca, Sr) 2MgAl, 6O27:Eu2+, Mn2+, and mixtures thereof.

12. The lighting apparatus of claim 1, wherein said blue phosphor is present in a spectral weight of from about 1 to 45%, said green phosphor is present in a spectral weight of from about 15 to 60%, said red phosphor is present in a spectral weight of from about 5 to 55%, and said orange phosphor is present in a spectral weight of from about 20 to 75%.

13. The lighting apparatus of claim 1, wherein said lighting apparatus has a general CRI (Ra) greater than 90.

14. The lighting apparatus of claim 1, wherein said lighting apparatus has a mean CRI (R1-R14) greater than 90.

15. The lighting apparatus of claim 1, herein said lighting apparatus has a CRI (Rg) greater than 80.

16. The lighting apparatus of claim 1, wherein a color point of said phosphor material lies on or substantially on the black body locus of the CIE chromaticity diagram.

17. The lighting apparatus of claim 1, wherein said lighting apparatus has a CCT of from about 2500 to 8000 K.

* * * * *